(12) United States Patent
Chen et al.

(10) Patent No.: US 8,536,456 B2
(45) Date of Patent: Sep. 17, 2013

(54) PRINTED CIRCUIT BOARD

(75) Inventors: Yung-Chieh Chen, Tu-Cheng (TW);
Shou-Kuo Hsu, Tu-Cheng (TW);
Hsien-Chuan Liang, Tu-Cheng (TW);
Shin-Ting Yen, Tu-Cheng (TW);
Dan-Chen Wu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 193 days.

(21) Appl. No.: 13/156,359

(22) Filed: Jun. 9, 2011

(65) Prior Publication Data

US 2012/0273258 A1 Nov. 1, 2012

(30) Foreign Application Priority Data

Apr. 26, 2011 (TW) .............................. 100114533 A

(51) Int. Cl.
*H05K 1/09* (2006.01)
(52) U.S. Cl.
USPC ........................................................... 174/251
(58) Field of Classification Search
CPC ........................................................ H05H 1/09
USPC .................................................. 174/251, 262
See application file for complete search history.

(56) References Cited

U.S. PATENT DOCUMENTS

| 7,874,065 B2 * | 1/2011 | Nguyen et al. ................... 29/830 |
| 2011/0230096 A1 * | 9/2011 | Atkinson et al. .......... 439/607.08 |
| 2012/0152607 A1 * | 6/2012 | Chen et al. ..................... 174/266 |
| 2012/0229997 A1 * | 9/2012 | Su et al. ......................... 361/767 |

* cited by examiner

*Primary Examiner* — Timothy Thompson
*Assistant Examiner* — Charles Pizzuto
(74) *Attorney, Agent, or Firm* — Altis Law Group, Inc.

(57) ABSTRACT

A printed circuit board includes a first signal layer, a first reference layer, a second signal layer, and a third signal layer in that order and includes a first slanted via and a second slanted via. The first signal layer includes an parallel first transmission wire and a second transmission wire. The first and second transmission wires are coupled with each other and cooperatively constitute a first differential pair with an edge-coupled structure. The second signal layer includes a third transmission wire. The third signal layer includes a fourth transmission wire parallel to and coupled with the third transmission wire. The third and fourth transmission wires cooperatively constitute a second differential pair with a broadside-coupled structure. The first slanted via obliquely are interconnected between the first transmission wire and the third transmission wire. The second slanted via obliquely are interconnected between the second transmission wire and the fourth transmission wire.

8 Claims, 5 Drawing Sheets

PRINTED CIRCUIT BOARD

BACKGROUND

1. Technical Field

The present disclosure relates to a printed circuit board (PCB).

2. Description of Related Art

Differential pairs are often used in a multi-layer PCB to transmit signals. A PCB usually has an edge-coupled differential pair in which two transmission wires are defined in the same signal layer and are coupled with each other. The PCB may also have a broadside-coupled differential pair in which two transmission wires are defined in two different signal layers and are coupled with each other. If an edge-coupled differential pair and a broadside-coupled differential pair are simultaneously used in a multi-layer PCB, each transmission wire will have a coupled portion and an uncoupled portion. A vertical via which stands for "vertical interconnect access" is used in vertical electrical connection between different layers in PCB design. However, the uncoupled portion may cause inconsistent impedance of the differential pairs. As a result, the signal transmission is influenced.

Therefore, it is desirable to provide a printed circuit board, which can overcome or at least alleviate the limitations described.

DETAILED DESCRIPTION

Figure 1:
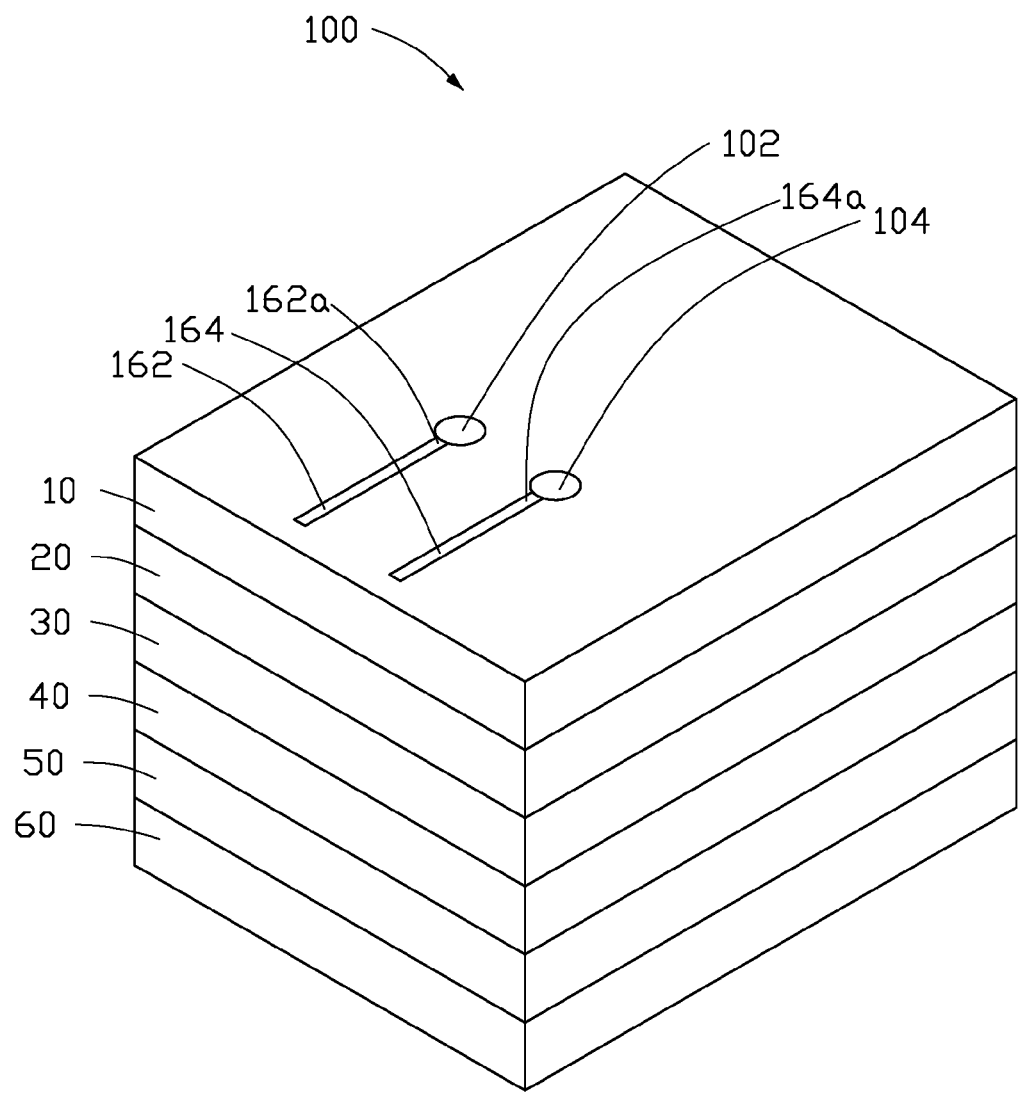
FIG. 1 is a schematic, isometric view of a PCB, according to a first exemplary embodiment.
Figure 2:
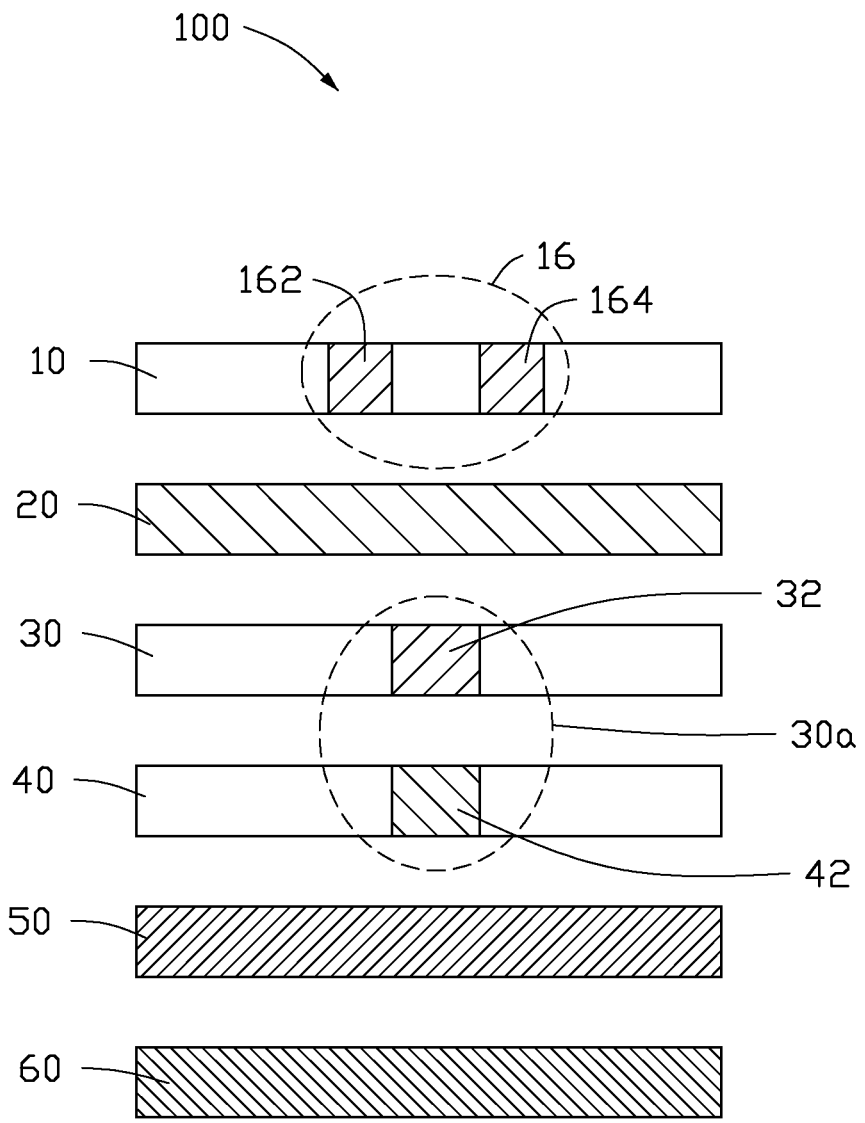
FIG. 2 is a schematic view of the PCB of FIG. 1, showing a layout of the PCB.

Referring to FIGS. 1-2, a PCB 100, according to a first exemplary embodiment, includes a first signal layer 10, a first reference layer 20, a second signal layer 30, a third signal layer 40, a second reference layer 50, and a base 60 stacked one on another in that order.

Figure 3:
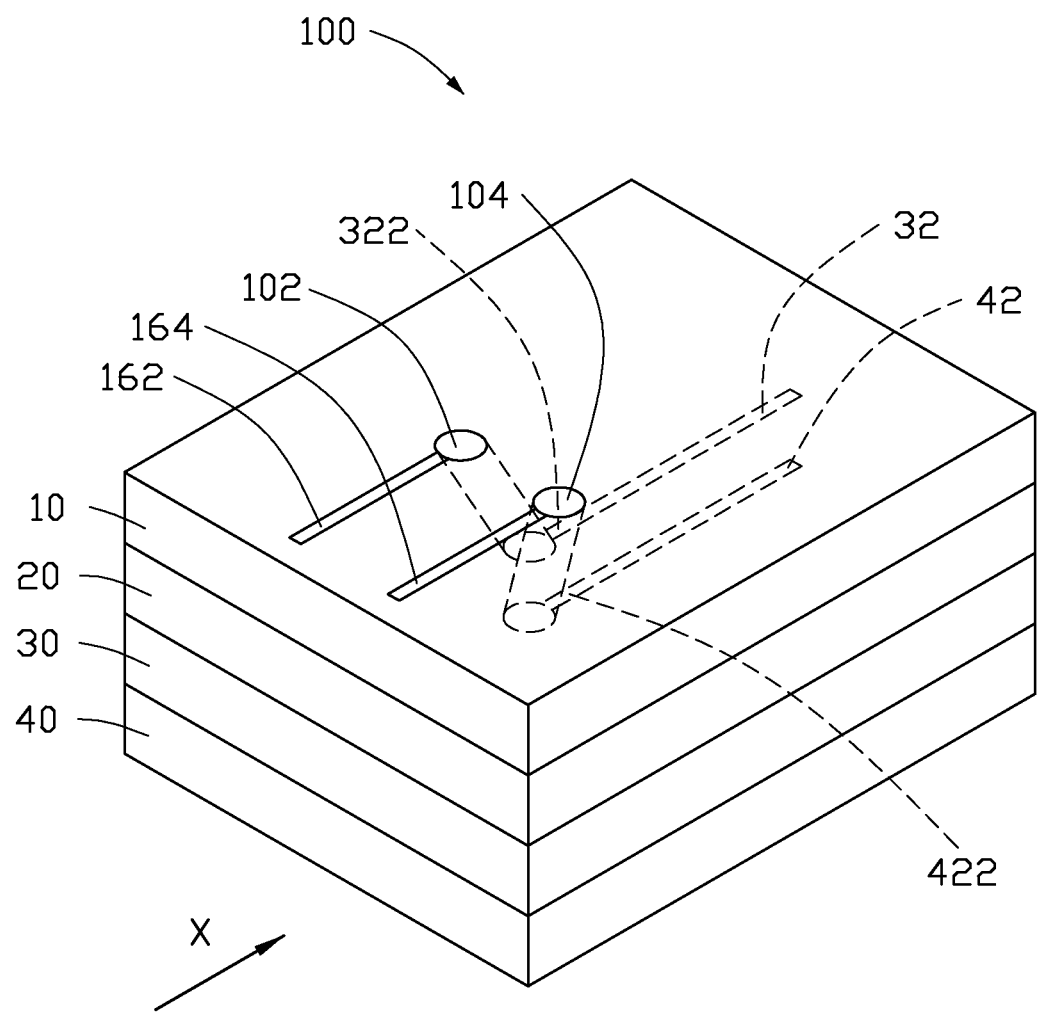
FIG. 3 is an isometric view of the PCB of FIG. 1.
Figure 4:
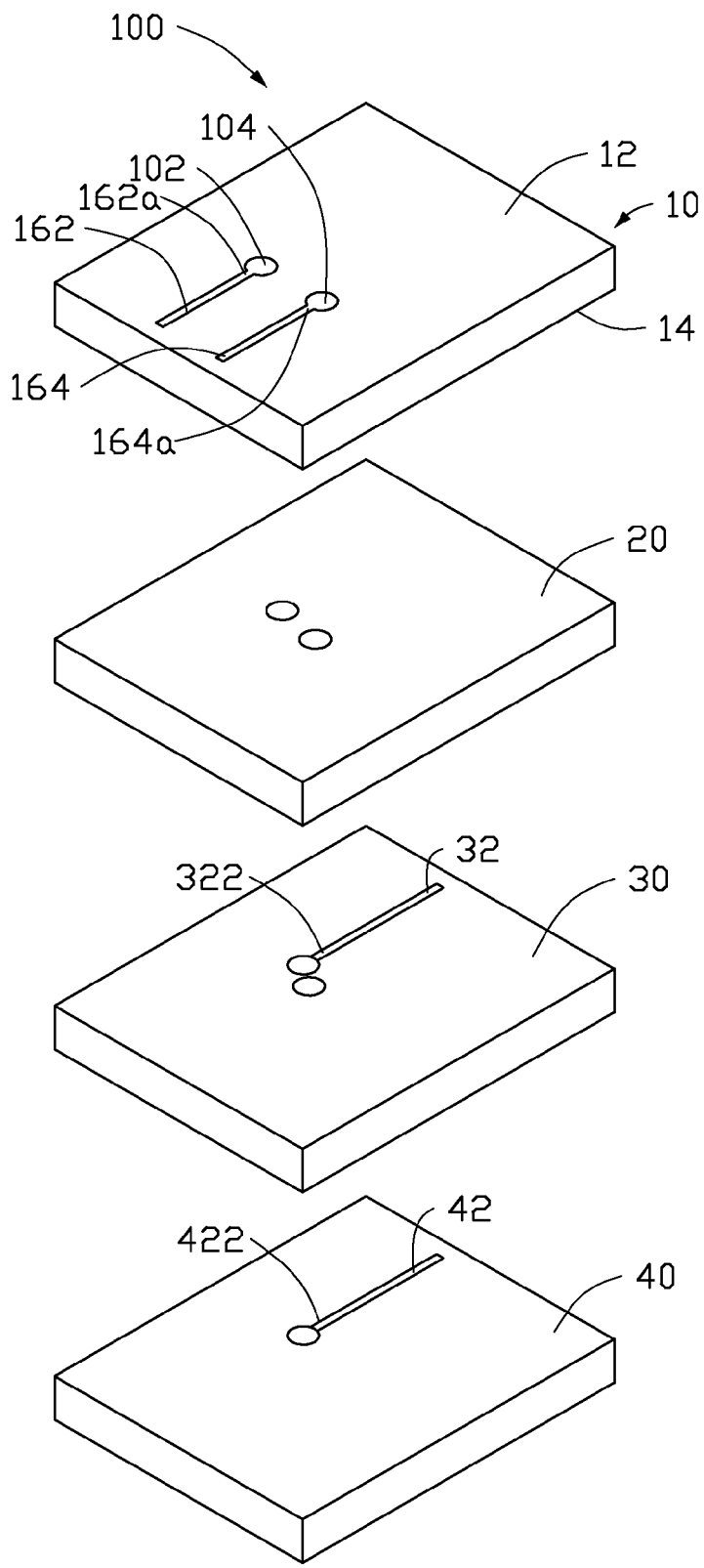
FIG. 4 is an exploded view of the PCB of FIG. 3.

Referring also to FIGS. 3-4, the first signal layer 10 includes a first surface 12 and a second surface 14. The first surface 12 and the second surface 14 are positioned at opposite sides of the first signal layer 10. A first differential pair 16 with an edge-coupled structure is defined in the first surface 12. In other words, the first differential pair 16 is an edge-coupled differential pair. The first differential pair 16 includes a first transmission wire 162 and a second transmission wire 164. The first transmission wire 162 is parallel to and coupled with the second transmission wire 164. The first transmission wire 162 includes a first connection end 162a. The second transmission wire 164 includes a second connection end 164a. Electronic elements (not shown), such as capacitors, inductors, and resistors are arranged on the first surface 12.

The first reference layer 20 and the second reference layer 50 can be ground layers or power source layers. The first reference layer 20 is positioned between and attached to the second surface 14 and the second signal layer 30. The second reference layer 50 is positioned between and attached to the third signal layer 40 and the base 60. Electronic elements (not shown), such as capacitors, inductors, and resistors are arranged on the base 60.

A second differential pair 30a with a broadside-coupled structure is defined in the second and third signal layers 30, 40. In other words, the second differential pair 30a is a broadside-coupled differential pair. The second differential pair 30a includes a third transmission wire 32 in the third signal layer 30 and a fourth transmission wire 42 in the fourth signal layer 40. The third transmission wire 32 is parallel to and coupled with the fourth transmission wire 42. The third transmission wire 32 includes a third connection end 322. The fourth transmission wire 42 includes a fourth connection end 422.

A first slanted via 102 and a second slanted via 104 are defined in the PCB 100. The first slanted via 102 is not parallel or interconnected with the second slanted via 104. The first slanted via 102 passes through the first signal layer 10 and the first reference layer 20. One end of the first slanted via 102 is connected to the first connection end 162a, the other end of the first slanted via 102 is connected to the third connection end 322, thereby, the first transmission wire 162 is electrically connected to the third transmission wire 32. The second slanted via 104 passes through the first signal layer 10, the first reference layer 20, and the second signal layer 30. One end of the second slanted via 104 is connected to the second connection end 164a, the other end of the second slanted via 104 is connected to the fourth connection end 422, thereby, the second transmission wire 164 is electrically connected to the fourth transmission wire 42. As a result, uncoupled portions of the four transmission wires 162, 164, 32, and 42 can be shortened. This will assure the consistency of the impedance of the two differential pairs 16 and 30a. Therefore, the signal transmission quality is assured.

The first differential pair 16 only references the first reference layer 20. The electronic field of the first differential pair 16 is mainly induced between the first transmission wire 162 and the second transmission wire 164, and between the first differential pair 16 and the first reference layer 20, seldom between the second signal layer 30 and the fourth signal layer 40. The second differential pair 30a references the first reference layer 20 and the second reference layer 50. The electronic field of the second differential pair 30a is mainly induced between the third transmission wire 32 and the fourth transmission wire 42, seldom on the first signal layer 10.

Figure 5:
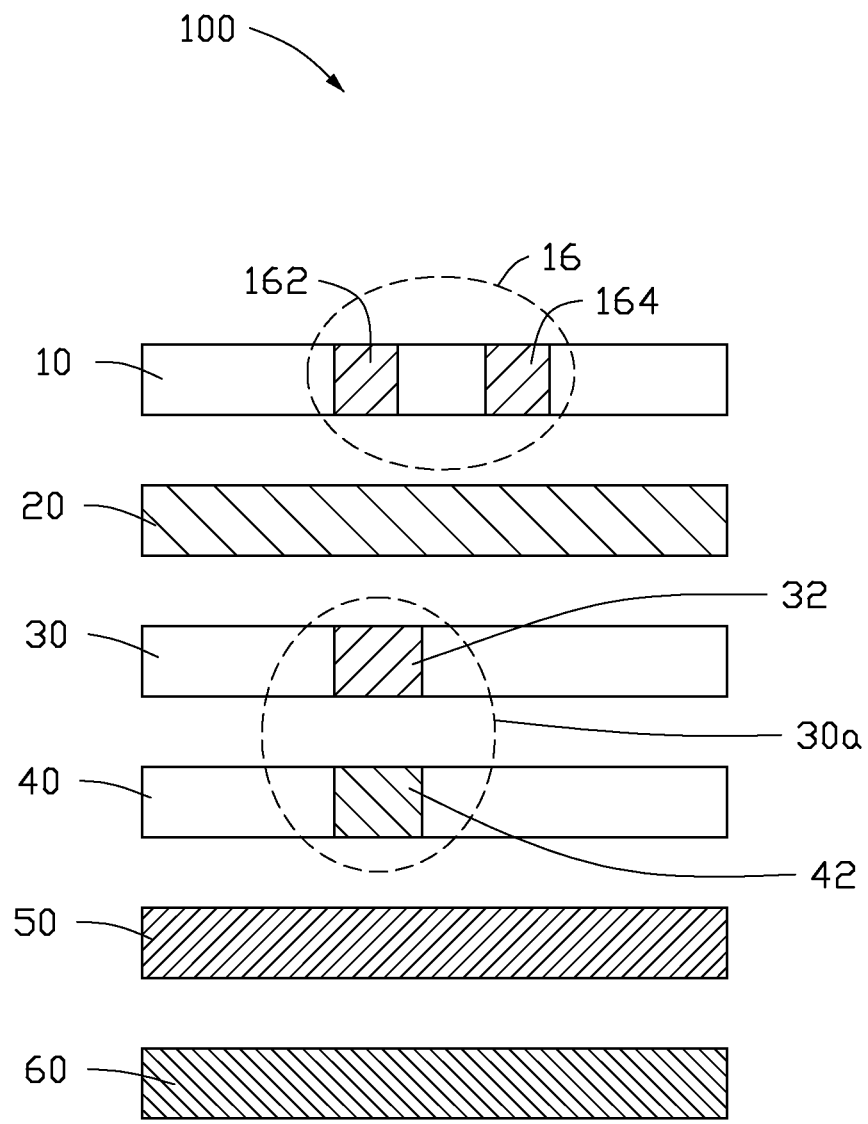
FIG. 5 is a schematic view of a PCB according to a second exemplary embodiment, showing a layout of the PCB.

Referring to FIGS. 2 and 5, in the first exemplary embodiment, the second differential pair 30a is aligned with a central line between the first transmission wire 162 and the second transmission wire 164. As such, crosstalk interference of the first differential pair 16 and the second differential pair 30a is reduced. In other embodiments, the second differential pair 30a may be aligned with the first transmission wire 162. The second differential pair 30a may be aligned with the second transmission wire 164.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A printed circuit board comprising a first signal layer, a first reference layer, a second signal layer, and a third signal layer stacked one on another in that order, the printed circuit board comprising a first slanted via and a second slanted via, the first signal layer comprising a first transmission wire and a second transmission wire parallel to the first transmission wire, the first and second transmission wires being coupled with each other and cooperatively constituting a first differential pair with an edge-coupled structure, the second signal layer comprising a third transmission wire, the third signal layer comprising a fourth transmission wire parallel to and coupled with the third transmission wire, the third and fourth transmission wires cooperatively constituting a second differential pair with a broadside-coupled structure, the first slanted via obliquely interconnected between the first transmission wire and the third transmission wire, the second slanted via obliquely interconnected between the second transmission wire and the fourth transmission wire.

2. The printed circuit board as claimed in claim 1, further comprising a second reference layer, wherein the second reference layer is formed on an opposite side of the third signal layer to the second signal layer.

3. The printed circuit board as claimed in claim 2, further comprising a base, the second reference layer sandwiched between the base and the third signal layer.

4. The printed circuit board as claimed in claim 2, wherein the second differential pair is aligned with a central line between the first transmission wire and the second transmission wire.

5. The printed circuit board as claimed in claim 2, wherein the second differential pair is aligned with the first transmission wire.

6. The printed circuit board as claimed in claim 2, wherein the second differential pair is aligned with the second transmission wire.

7. The printed circuit board as claimed in claim 3, wherein the first transmission wire comprises a first connection end, the second transmission wire comprises a second connection end, the third transmission wire comprises a third connection end, the fourth transmission wire comprises a fourth connection end, one end of the first slanted via is connected to the first connection end, the other end of the first slanted via is connected to the third connection end, one end of the second slanted via is connected to the second connection end, and the other end of the second slanted via is connected to the fourth connection end.

8. The printed circuit board as claimed in claim 3, wherein the first slanted via passes through the first signal layer and the first reference layer, and the second slanted via passes through the first signal layer, the first reference layer, and the second signal layer.

* * * * *